(12) United States Patent
McLennan

(10) Patent No.: US 7,440,882 B1
(45) Date of Patent: Oct. 21, 2008

(54) METHOD AND SYSTEM FOR ANALYZING TRANSACTION LEVEL SIMULATION DATA OF AN INTEGRATED CIRCUIT DESIGN

(75) Inventor: Michael J. McLennan, Allentown, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 582 days.

(21) Appl. No.: 10/335,116

(22) Filed: Dec. 31, 2002

(51) Int. Cl.
*G06F 17/50* (2006.01)
(52) U.S. Cl. .................................... 703/14
(58) Field of Classification Search .............. 703/14
See application file for complete search history.

(56) References Cited

U.S. PATENT DOCUMENTS

| | | | |
|---|---|---|---|
| 6,163,763 A * | 12/2000 | Cox et al. ............... | 703/17 |
| 6,263,301 B1 * | 7/2001 | Cox et al. ............... | 703/14 |
| 6,275,785 B1 * | 8/2001 | Currie et al. ............ | 703/13 |
| 6,845,341 B2 * | 1/2005 | Beverly et al. .......... | 702/182 |
| 6,904,409 B1 * | 6/2005 | Lambert et al. ......... | 705/10 |
| 7,055,116 B2 * | 5/2006 | Marschner et al. ...... | 716/4 |
| 7,283,944 B2 * | 10/2007 | Tsai et al. ............... | 703/15 |
| 2003/0225560 A1 * | 12/2003 | Garcia et al. ............ | 703/17 |
| 2004/0054500 A1 * | 3/2004 | Beverly et al. .......... | 702/182 |

OTHER PUBLICATIONS

SimVision Waveform Viewer User Guide, teaches a method for view of transaction-based verification simulation results, Jan. 2002.*

Cadence Design Systems, Inc., Transaction-Based Verification: TestBuilder Reference Manual, Product Version 1.10, Jun. 2000, 212 pages, located at http://www.ee.virginia.edu/~mrs8n/cadence/SynthesisTutorials/testbuilderref.pdf.

Zhang, E. et al. Functional Verification with Completely Self-Checking Tests IEEE International 1997 Verilog HDL Conference, Mar. 31-Apr. 2, 1997, pp. 2-9.

Cadence Design Systems, Inc., Transaction Based Verification White Paper, 12 pages, located at http://www.cadence.com/whitepapers/transac.pdf.

Cadence Design Systems, Inc., Corporate Brochure, 2001, 11 pages, located at http://www.cadence-europe.com/corporate/about/corporate_brochure.pdf.

Cadence Design Systems, Inc., Chapter 12—Viewing Transactions, SimVision Waveform Viewer User Guide, Product Version 3.40, Jan. 2002, pp. 137-145.

Cadence Design Systems, Inc., Chapter 7—Viewing Transactions, Signalscan Waves User Guide, Product Version 6.80, 2002, pp. 152-159.

Design Acceleration Inc., DAI Signalscan User's Guide, DAI Signalscan Version 6.2, Feb. 12, 1999, 260 pages, located at http://www.designacc.com/docs/signalscan/signalscan.pdf.

* cited by examiner

*Primary Examiner*—Zoila E. Cabrera
*Assistant Examiner*—Andre Pierre Louis
(74) *Attorney, Agent, or Firm*—Vista IP Law Group LLP

(57) ABSTRACT

A method and system for analyzing transaction level simulation data of an integrated circuit design. In an embodiment, a transaction fiber is plotted. The transaction fiber comprises a transaction block. A compact representation of a child block of the transaction block is provided when the transaction fiber is in a collapsed state. In one embodiment, the compact representation of the child block is provided by drawing a line segment below the transaction fiber.

45 Claims, 8 Drawing Sheets

_(1)_

METHOD AND SYSTEM FOR ANALYZING TRANSACTION LEVEL SIMULATION DATA OF AN INTEGRATED CIRCUIT DESIGN

BACKGROUND AND SUMMARY

The present invention is related to design verification tools. More particularly, the present invention is directed to a method and system for analyzing transaction level simulation data of an integrated circuit design.

Integrated circuit designers use many different techniques to verify the functional correctness of a design before chips are actually produced. One common method of verification is the use of simulation. Simulation dynamically verifies a design by monitoring behaviors of the design with respect to simulation test benches. Designers can simulate their designs at the signal level or at the transaction level. Simulating at the transaction level allows designers to debug their designs at a higher level of abstraction than when simulating at the signal level. Designers write software code which records the high-level functionality of their chip as a string of transaction blocks called a "fiber." For example, a transaction block can be defined to represent a value "read" operation. In this way, designers can monitor transaction blocks rather than individual signals when debugging their designs.

Each transaction block on a fiber has a definite start time, end time, a label, and a series of details, including things such as memory addresses, data values, and so forth. Each transaction block can have one or more related child transaction blocks, which represent pieces of the high-level operation. For any selected transaction block, a subordinate transaction block is called its child and its superordinate transaction block is called its parent. Each of the child transaction blocks can have their own child transaction blocks, and so forth. Thus, the different levels of related transaction blocks represent a hierarchy of subdivided actions.

A method of analyzing transaction level simulation data is to plot transaction fibers as a function of time. This method allows designers to better visualize the simulation data. In previous design verification tools, to view the number and position of child transaction blocks, a parent fiber had to be in an expanded state, i.e., child fibers of the parent fiber had to be plotted beneath the parent fiber. However, if all of the child fibers are visible, other fibers that a designer wishes to view may not be visible. Hence, there is a need for a method of analyzing transaction level simulation data such that designers will be able to determine if a fiber has any child fibers but at the same time be able to view several unrelated fibers.

The present invention provides a method and system for analyzing transaction level simulation data of an integrated circuit design. In an embodiment, a transaction fiber is plotted. The transaction fiber comprises a transaction block. A compact representation of a child block of the transaction block is provided when the transaction fiber is in a collapsed state. In one embodiment, the compact representation of the child block is provided by drawing a line segment below the transaction fiber.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The accompanying drawings are included to provide a further understanding of the invention and, together with the Detailed Description, serve to explain the principles of the invention.

DETAILED DESCRIPTION

Figure 1:
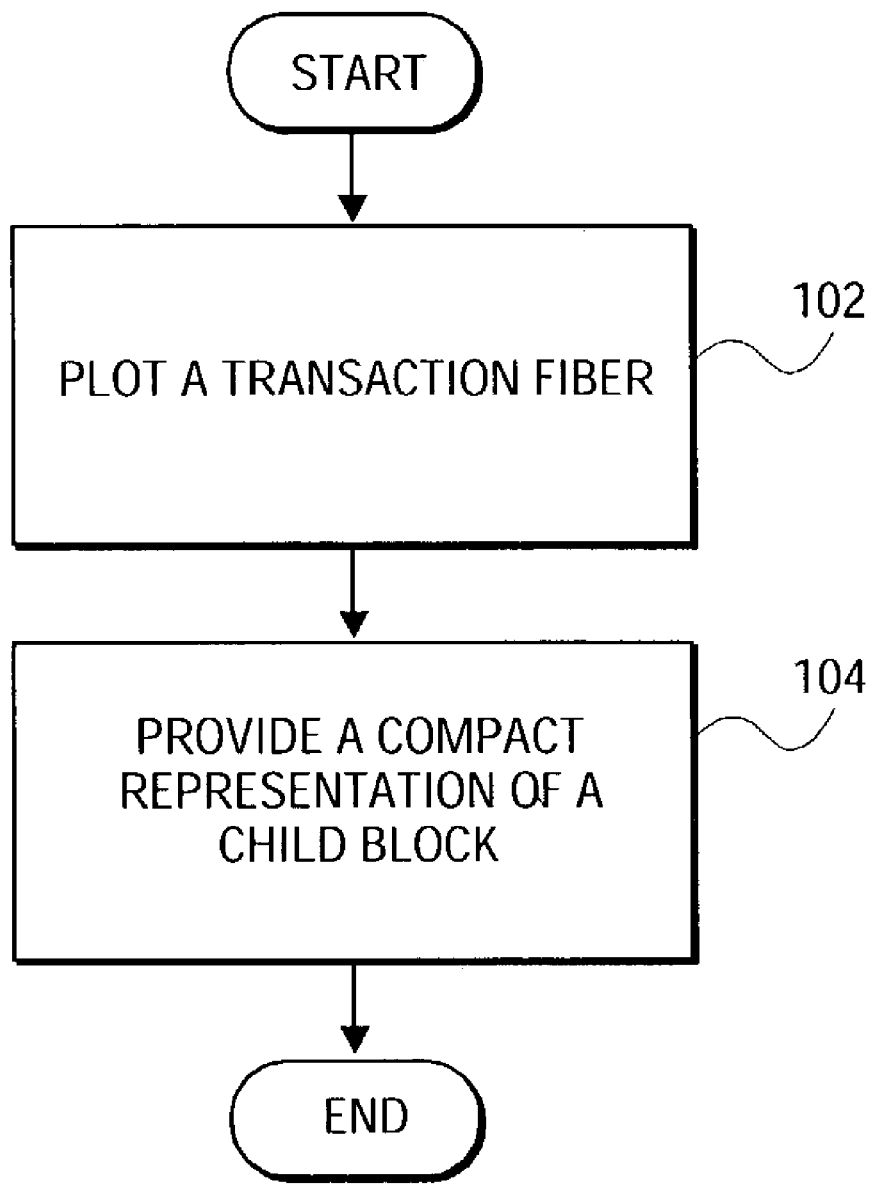
FIG. 1 depicts a process flow chart of an embodiment of the present invention.

The present invention provides a method and system for analyzing transaction level simulation data of an integrated circuit design. FIG. 1 depicts a process flow diagram of an embodiment of the invention. In this embodiment, a transaction fiber is plotted (102). The transaction fiber comprises a transaction block. A compact representation of a child block of the transaction block is provided when the transaction fiber is in a collapsed state (104).

Figure 2A:
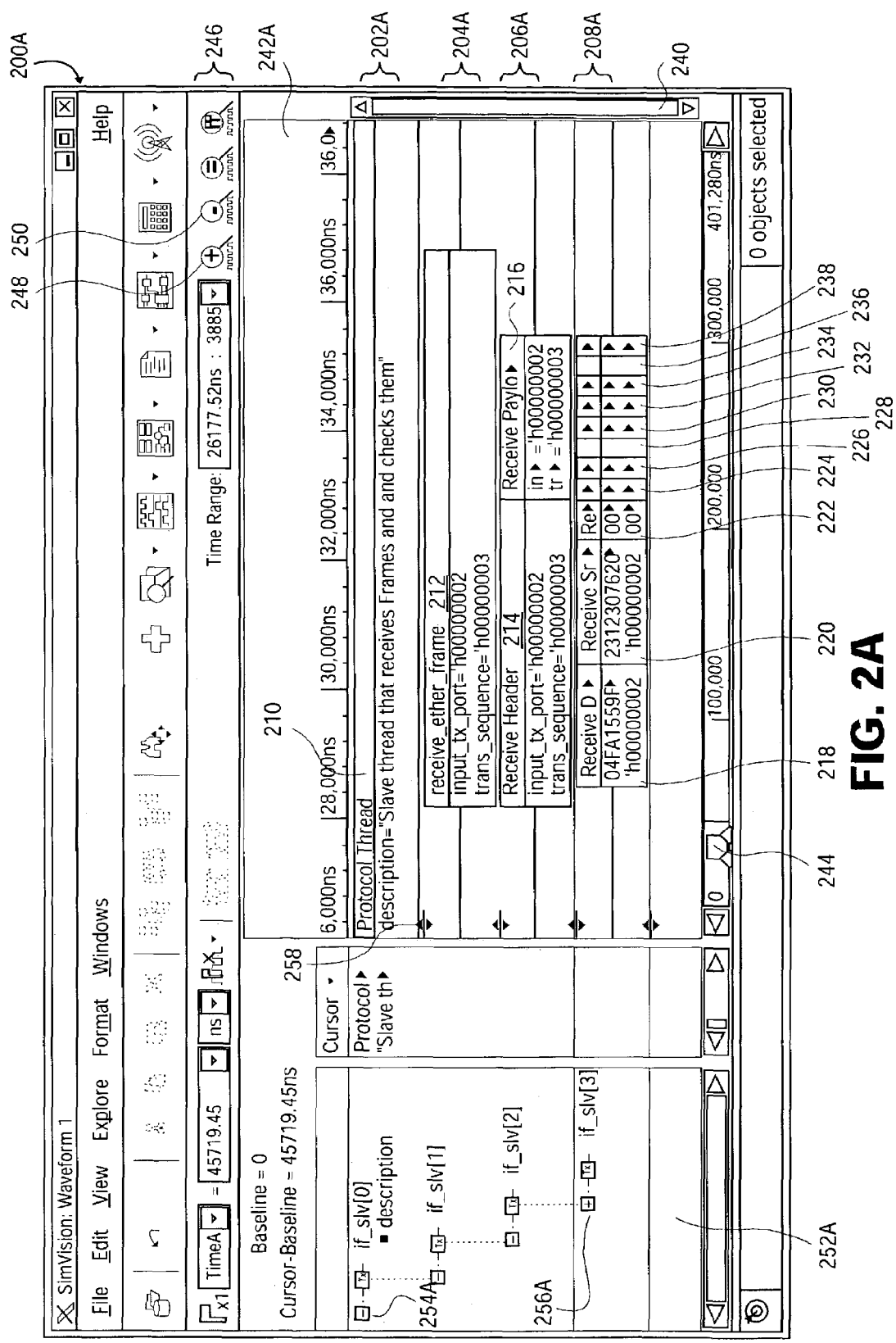
FIGS. 2A-2C show a waveform window in a simulation analysis tool displaying transaction fibers in various states according to different embodiments of the present invention.

FIG. 2A shows a waveform window 200A in a simulation analysis tool displaying several transaction fibers in an expanded state in waveform area 242A according to an embodiment of the invention. In the embodiment, a minus sign on a button next to a fiber name signifies that the fiber is in an expanded state. For example, fiber if_slv[0] 202A, with a transaction block labeled "Protocol Thread" 210, is in an expanded state as there is a minus sign on button 254A in signal list area 252A. Fiber 202A can be collapsed by clicking on button 254A. When a fiber is in a collapsed state, there is a plus sign on the button next to the fiber name. For example, child fiber if_slv[3] 208A in FIG. 2A is in a collapsed state as there is a plus sign on button 256A in signal list area 252A.

In the embodiment, transactions are displayed as rectangular areas that span periods of simulation time. These areas contain information about the transactions, e.g., transaction attribute values or transaction description. In FIG. 2A, "Protocol Thread" 210 includes a description, "Slave thread that receives Frames and checks them." In the embodiment, a user can zoom in and out of the waveform plot by reducing or enlarging the size of scroll bar 244 at the bottom of waveform area 242. Alternatively, the user can zoom in and out incrementally using zoom buttons 248 and 250 in tool bar 246.

Beneath fiber 202A is a child fiber if_slv[1] 204A, also in an expanded state, with a block 212 labeled "receive_either frame." In the embodiment, child fibers have the same name as the parent fiber, with a bracketed number indicating the hierarchy depth that the child fiber represents. Beneath if_slv[1] fiber 204A are two more child fibers 206A and 208A, representing further subdivisions of transaction block 212. Child fiber if slv[2] 206A has two transaction blocks, one labeled "Receive Header" 214 and the other labeled "Receive Payload" 216, both of which are child transaction blocks of "receive_either_frame" 212 on if_slv[1] fiber 204A.

Child fiber if slv[3] 208A has eleven transaction blocks 218-238. Three of the eleven transaction blocks 218-222 on if_slv[3] 208A are related to "Receive Header" 214 on if_slv[2] 206A. The other eight transaction blocks 224-238 on if slv[3] 208A are related to "Receive Payload" 216 on if_slv[2] 206A. A user can use scroll bar 240 on the right side of waveform area 242A to scroll through various child fibers in the hierarchy.

Figure 2B:
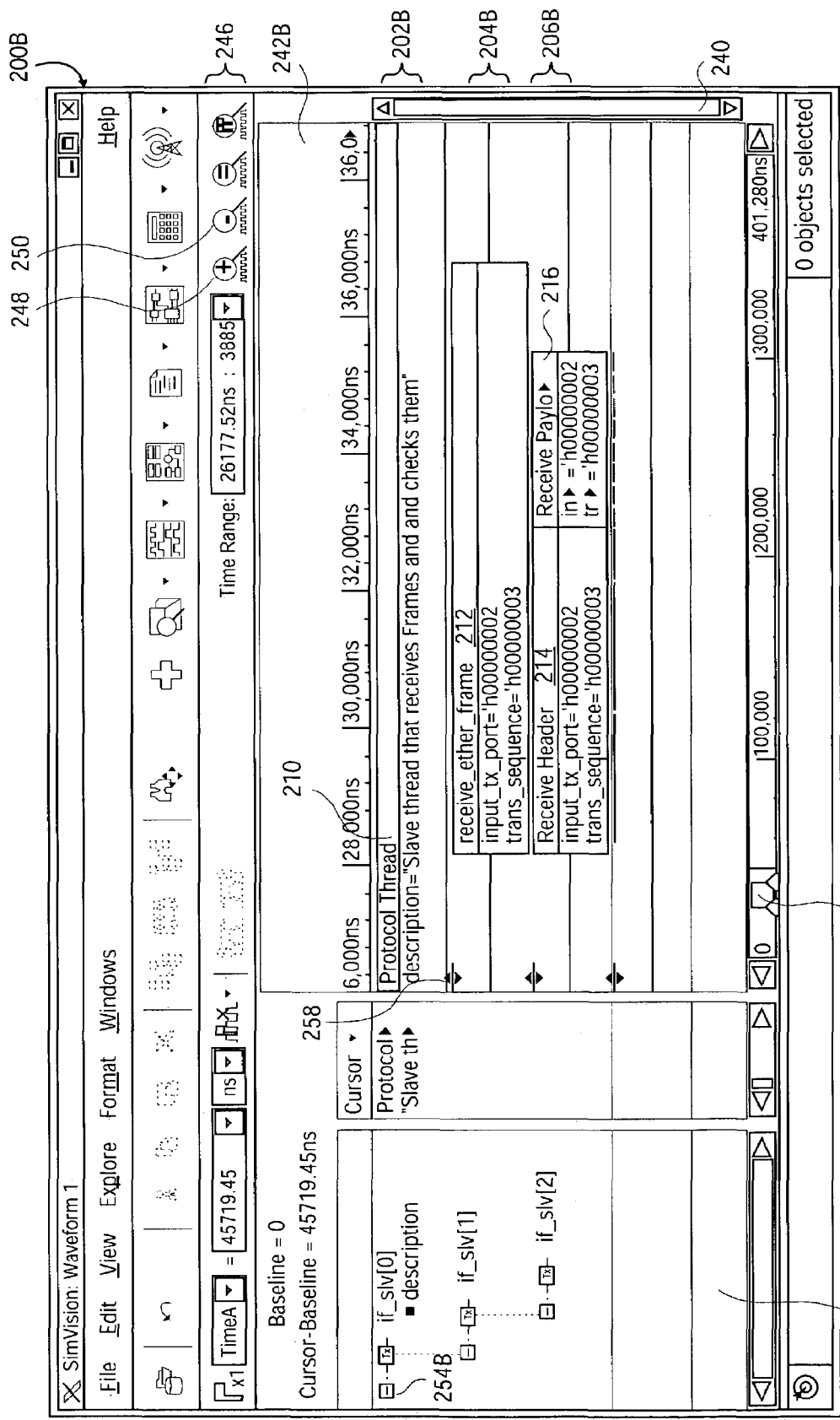

FIG. 2B shows a waveform window 200B in a simulation analysis tool illustrating transaction fibers in various states according to another embodiment of the invention. In this embodiment, fiber if slv[2] 206B is in a collapsed state. Child fiber if slv[3] 208A is now hidden, but small line segments representing its blocks 218-238 are drawn along the bottom of parent fiber if_slv[2] 206B. Since if slv[3] 208A in FIG. 2A is in a collapsed state and has no line segments beneath it, fiber 208A has no child fibers. In other embodiments, alternative compact representations of child blocks can be used, for example, small blocks or zigzags. In another embodiment, compact representations of child blocks need not be beneath the parent fiber. For example, a description can be included in the parent transaction block identifying the number of child blocks. In an embodiment, when a parent fiber is in a collapsed state, compact representations of child blocks—at all levels of hierarchy below it—are provided.

Figure 2C:
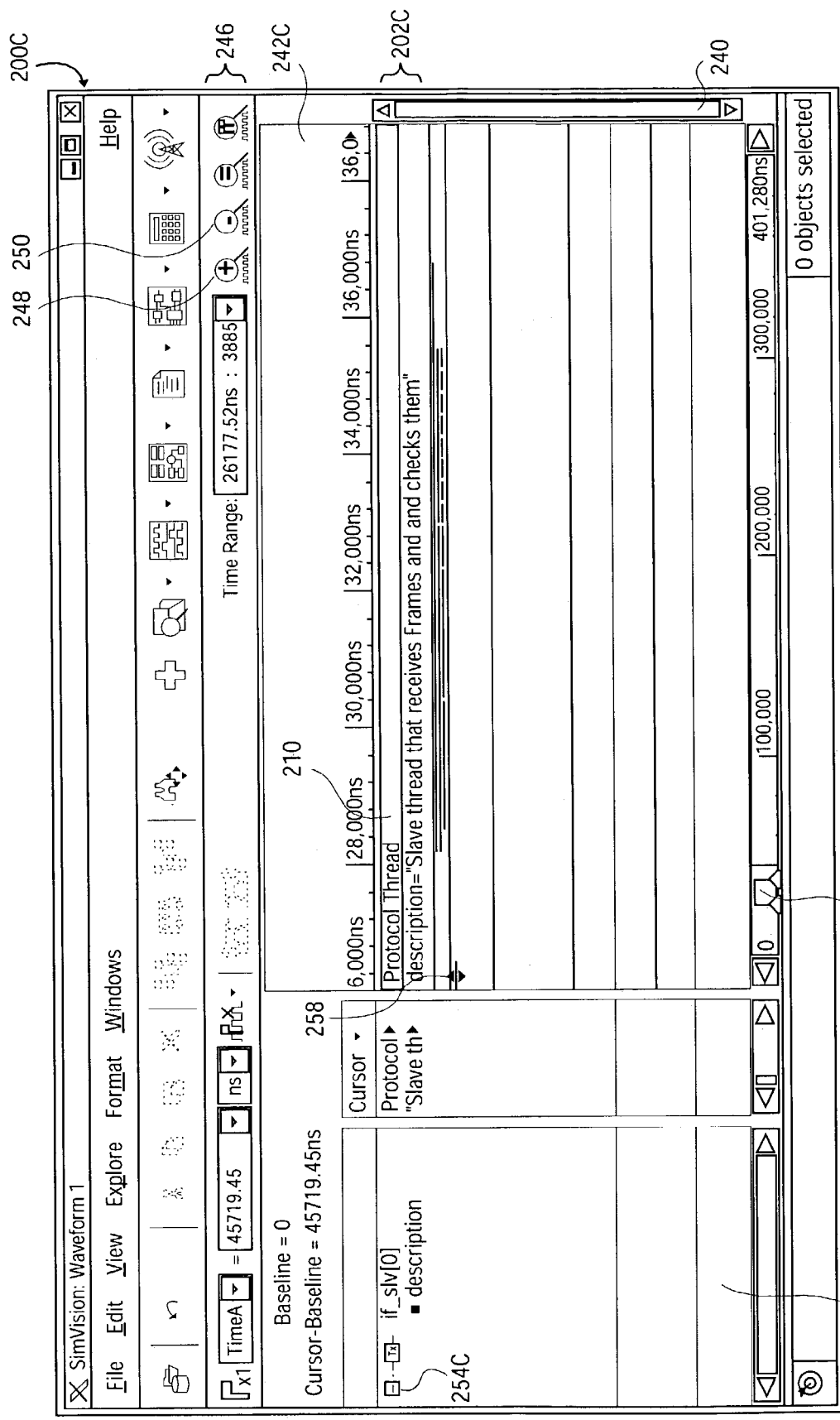

FIG. 2C shows a waveform window 200C in a simulation analysis tool illustrating a transaction fiber in a collapsed state according to a further embodiment of the invention. In this embodiment, fiber if slv[0] 202C is in a collapsed state and all of the child fibers 204-208 are hidden. All hidden child blocks 212-238 appear as small line segments below the only visible fiber 202C. This provides useful information about the number and position of child transactions without taking plotting space away from other fibers in the same window. In one embodiment, a user can enlarge the vertical space allocated for a fiber by dragging a slider below the fiber downward. For example, in FIG. 2C, to enlarge the vertical space for fiber 202C, the user can drag slider 258 downward.

In one embodiment, the illustration in FIG. 2C is how if slv[0] fiber 202 would appear when plotted in a new window. Instead of having to expand fiber 202C to see child blocks 212-238 as in earlier simulation analysis tools, a user can see at a glance that transaction fiber 202C has three child fibers 204-208 and discern the relative positions of child blocks 212-238 on child fibers 204-208. In an embodiment, the user can leave a fiber in a collapsed state while expanding one or more of its child fibers. In another embodiment, the user can expand all child fibers of a fiber by expanding the fiber. In a further embodiment, the user can expand a child fiber by clicking on the compact representation of a child block on that fiber.

Figure 3:
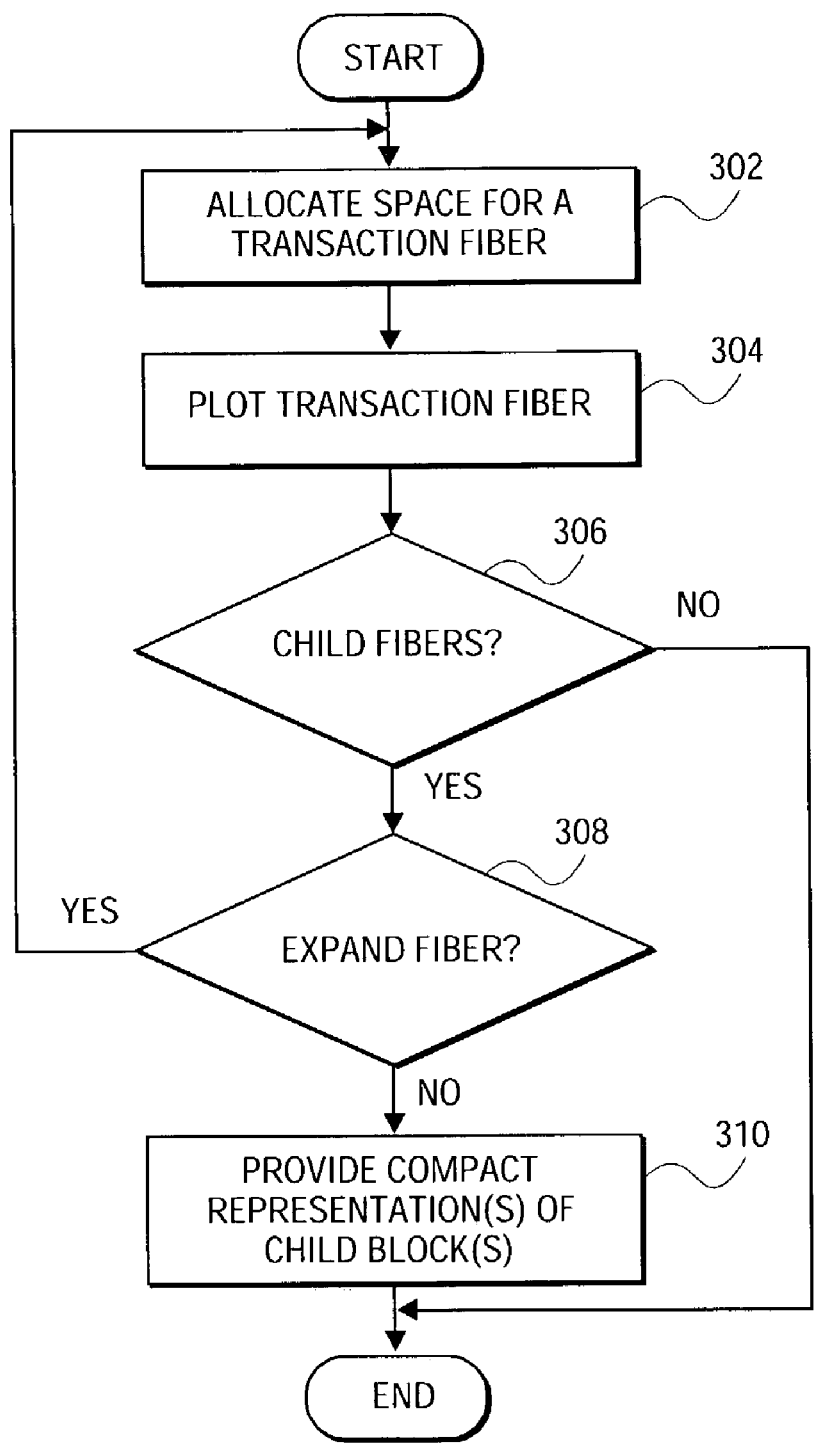
FIG. 3 illustrates a flow chart of a method for analyzing transaction level simulation data according to one embodiment of the present invention.

FIG. 3 illustrates a flow chart of an algorithm for analyzing transaction level simulation data according to an embodiment of the invention. Space is allocated for a transaction fiber (302). The transaction fiber is plotted within the allocated space (304). Each transaction block on the fiber is drawn within the space allocated according to the start and end times for the block. A determination is made as to whether the fiber has any child fibers (306). If there are no child fibers, the process ends. If the fiber has one or more child fibers, a determination is made as to whether the fiber should be expanded (308). If the fiber is to be in an expanded state, the process returns to step 302 to allocate space for the first child fiber to be plotted. If the fiber is to be in a collapsed state, then compact representations of one or more child blocks in the one or more child fibers are provided (310).

Figure 4:
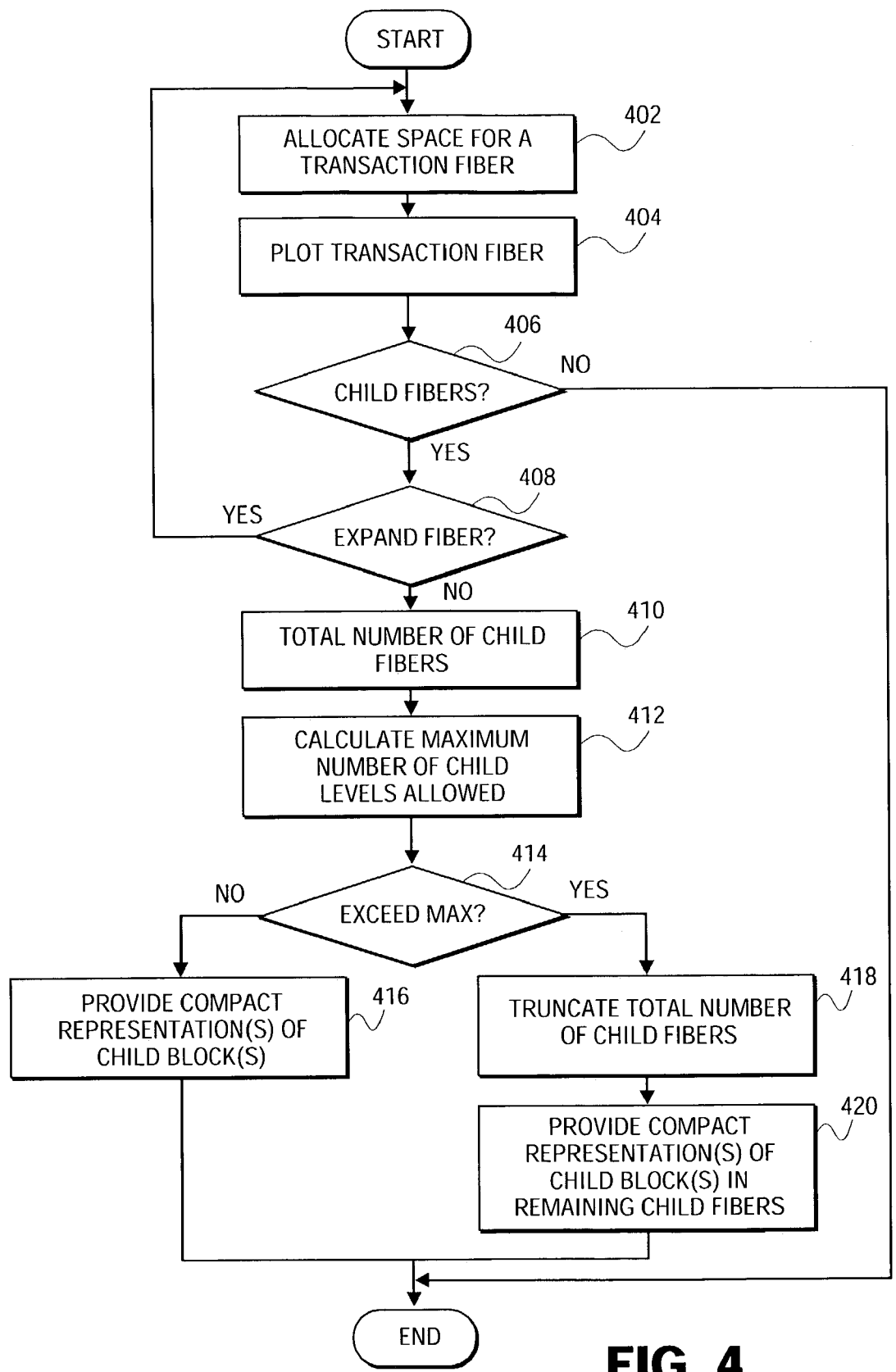
FIG. 4 depicts a process flow diagram of a method for analyzing transaction level simulation data according to another embodiment of the present invention.

In the embodiment of FIG. 4, in addition to the steps discussed above with respect to FIG. 3, the number of child fibers is totaled (410). A maximum number of child levels that can be included in the allocated space is calculated (412). A determination is made as to whether the total number of child fibers exceeds the maximum number of child levels allowed (414). If the total number of child fibers does not exceed the maximum number of child levels allowed, compact representations of child blocks in all of the child fibers are provided (416). If the maximum number of child levels allowed is less than the total number of child fibers, the total number of child fibers are truncated (418). Compact representations of child blocks in the remaining child fibers are provided (420).

In one embodiment, each level of child fiber takes up two pixels-one for the line, and one for the space above it. In an embodiment, if the number of pixels for the compact representation exceed the overall height of the parent fiber, then the number of child fibers is truncated such that $L=(h-1)/2$, where L is the maximum number of child levels allowed, and h is the height of the allocated space in pixels. That way, there is still a line one pixel tall for the parent fiber and a line one pixel tall for each of the child fibers that will fit in the view, with a space of one pixel between each of the fibers. In one embodiment, the area at the bottom of the allocated space (with a height of 2 L pixels) where the child fibers will be drawn is then blacked out, and the line segments representing child blocks for each child fiber are then drawn, starting at the bottom with the maximum child fiber level, and working upward.

Figure 5:
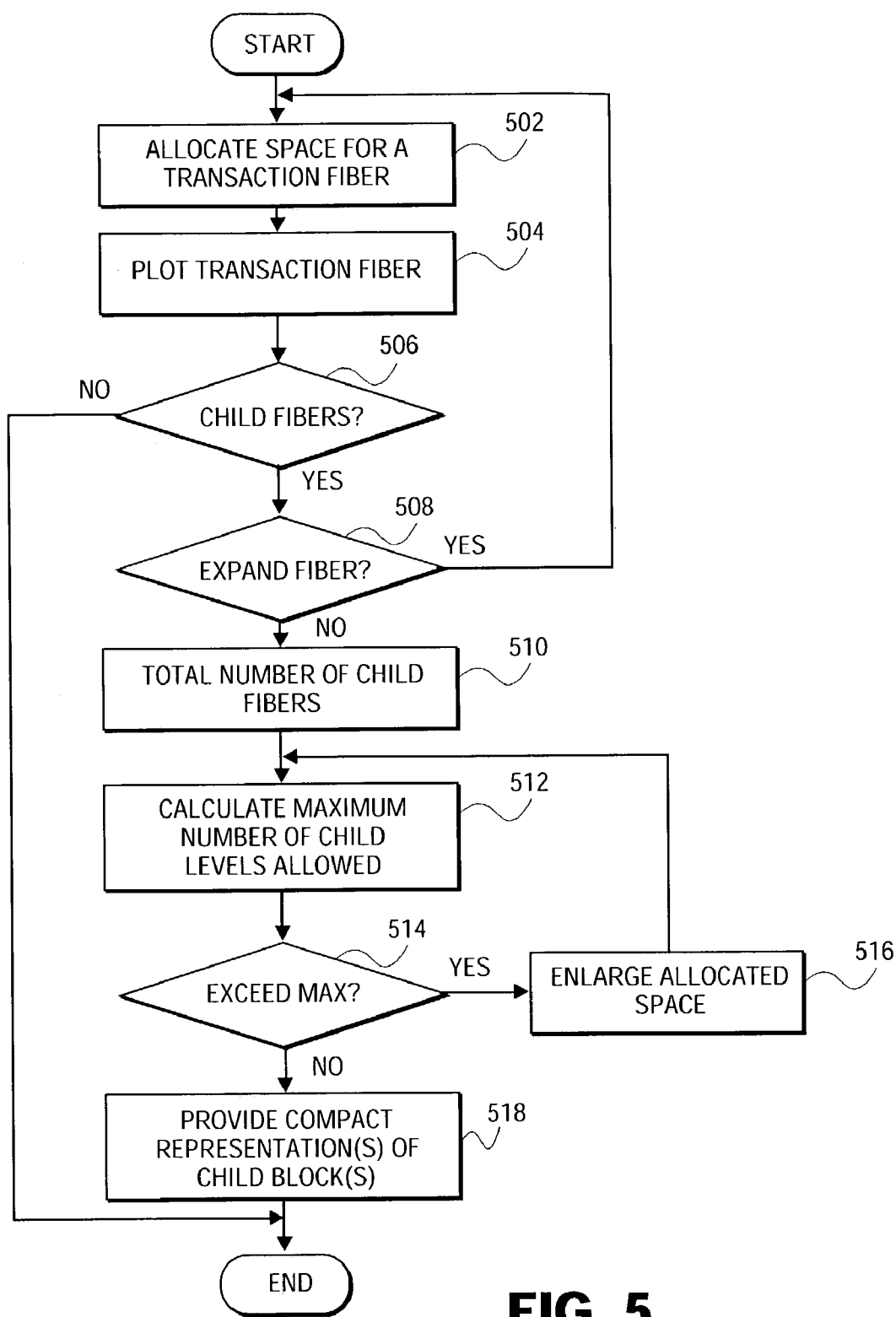
FIG. 5 shows a flow chart of a method for analyzing transaction level simulation data according to a further embodiment of the present invention.

An alternative embodiment is illustrated in FIG. 5. In this embodiment, instead of truncating the total number of child fibers when the total exceeds the maximum number of child levels allowed, the allocated space for the fiber is enlarged (516). Once the allocated space has been enlarged, the maximum number of child levels allowed is recalculated (512). A determination is made as to whether the total number of child fibers exceeds the recalculated maximum number of child levels allowed (514). If the total number of child fibers no longer exceeds the recalculated maximum number of child levels allowed, then compact representations of child blocks are provided (518). If the total number of child fibers exceeds the recalculated maximum number of child levels allowed, the allocated space is enlarged further (516).

Figure 6:
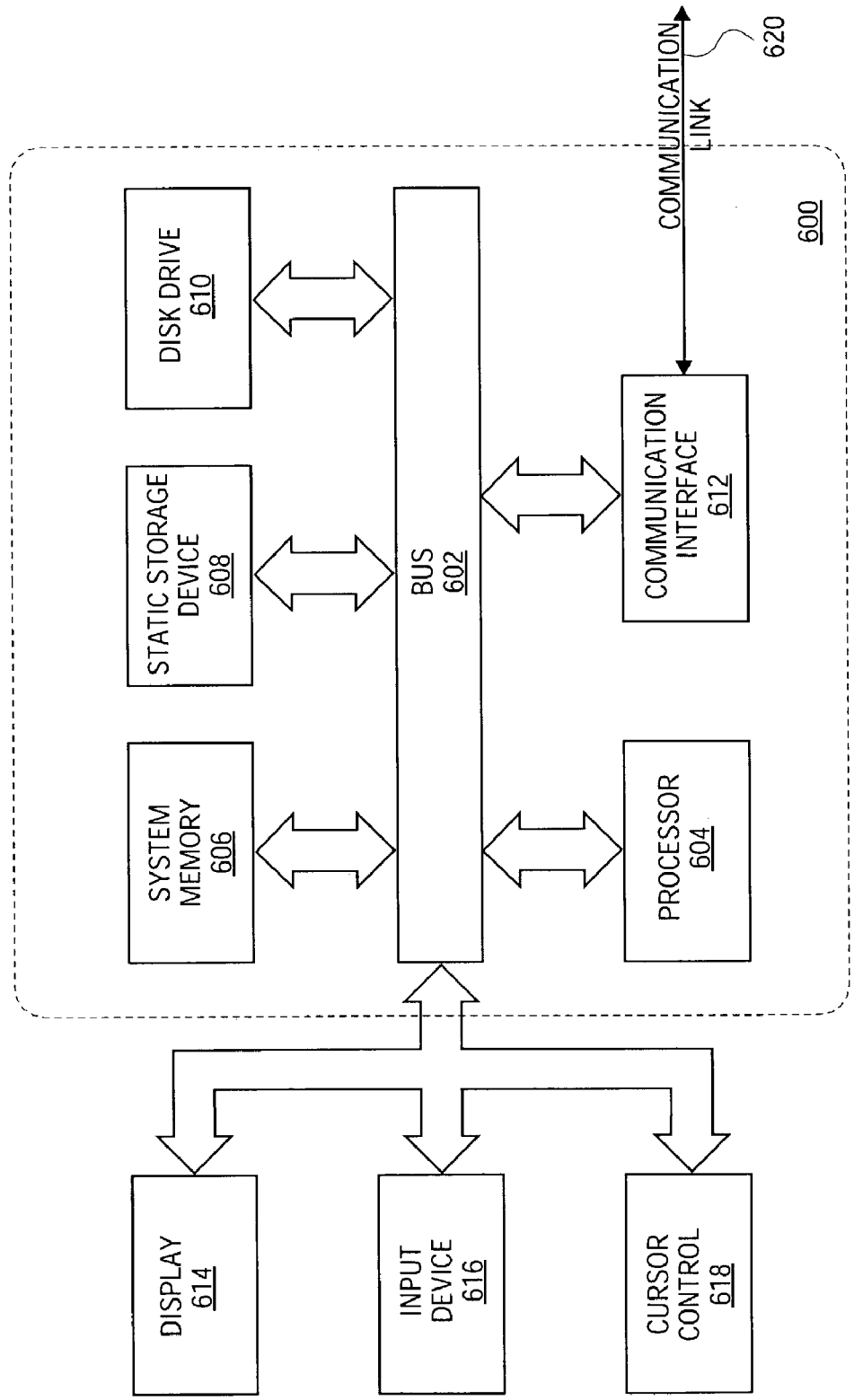
FIG. 6 is a block diagram of a computer system according to an embodiment of the present invention.

FIG. 6 is a block diagram of a computer system 600 suitable for implementing an embodiment of the present invention. Computer system 600 includes a bus 602 or other communication mechanism for communicating information, which interconnects subsystems and devices, such as processor 604, system memory 606 (e.g., RAM), static storage device 608 (e.g., ROM), disk drive 610 (e.g., magnetic or optical), communication interface 612 (e.g., modem or ethernet card), display 614 (e.g., CRT or LCD), input device 616 (e.g., keyboard), and cursor control 618 (e.g., mouse or trackball).

According to one embodiment of the invention, computer system 600 performs specific operations by processor 604 executing one or more sequences of one or more instructions contained in system memory 606. Such instructions may be read into system memory 606 from another computer readable medium, such as static storage device 608 or disk drive 610. In alternative embodiments, hard-wired circuitry may be used in place of or in combination with software instructions to implement the invention.

The term "computer readable medium" as used herein refers to any medium that participates in providing instructions to processor 604 for execution. Such a medium may take many forms, including but not limited to, non-volatile media, volatile media, and transmission media. Non-volatile media includes, for example, optical or magnetic disks, such as disk drive 610. Volatile media includes dynamic memory, such as system memory 606. Transmission media includes coaxial cables, copper wire, and fiber optics, including wires that comprise bus 602. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 600. According to other embodiments of the invention, two or more computer systems 600 coupled by communication link 620 (e.g., LAN, PTSN, or wireless network) may perform the sequence of instructions required to practice the invention in coordination with one another.

Computer system 600 may transmit and receive messages, data, and instructions, including program, i.e., application code, through communication link 620 and communication interface 612. Received program code may be executed by processor 604 as it is received, and/or stored in disk drive 610, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for analyzing transaction level simulation data of an integrated circuit design, comprising:
   allocating space for a transaction fiber, said transaction fiber comprising one or more transaction blocks and one or more child fibers;
   plotting said transaction fiber within said allocated space;
   calculating a maximum number of child levels allowed to be displayed in said allocated space; and
   graphically displaying one or more compact representations indicating a total number of hidden child levels and relative temporal positions of hidden child blocks for a fiber, which comprises the transaction fiber or the one or more child fibers, within said allocated space when said fiber is in a collapsed state,
   wherein the fiber is in a collapsed state when the one or more compact representations are displayed without taking plotting space away from other fibers, and
   wherein the one or more compact representations correspond to an expanded representation which comprises details of at least one of the one or more child fibers that is graphically represented by at least a portion of the one or more compact representations when the at least one of the one or more child fibers is in the collapsed state.

2. The method of claim 1, wherein said transaction fiber is in a collapsed state when said one or more child fibers are not plotted.

3. The method of claim 1, wherein graphically displaying one or more compact representations comprises drawing a line segment below said transaction fiber for each of said hidden child blocks.

4. The method of claim 1, wherein each of said one or more transaction blocks comprises one or more details.

5. A computer implemented method for analyzing transaction level simulation data of an integrated circuit design, comprising:
   plotting a transaction fiber, said transaction fiber comprising a transaction block representing a subordinate transaction fiber of the transaction fiber; and
   graphically displaying a compact representation of one or more hidden child blocks of said transaction block indicating a total number of hidden child levels and relative temporal positions of one or more subordinate blocks of the transaction block when said transaction fiber is in a collapsed state,
   wherein the transaction fiber is in a collapsed state when the compact representation is displayed without taking plotting space away from other transaction fibers, and
   wherein the compact representation corresponds to an expanded representation which comprises details of the subordinate transaction fiber that is graphically represented by at least a portion of the compact representation when the subordinate transaction fiber is in the collapsed state.

6. The method of claim 5, wherein said transaction block comprises one or more details.

7. The method of claim 6, wherein said one or more details includes a start time.

8. The method of claim 6, wherein said one or more details includes an end time.

9. The method of claim 6, wherein said one or more details includes a label.

10. The method of claim 6, wherein said one or more details includes a memory address.

11. The method of claim 6, wherein said one or more details includes a description of said transaction block.

12. The method of claim 5, wherein a transaction fiber is in a collapsed state when a child fiber of said transaction fiber is not plotted.

13. The method of claim 5, wherein providing a compact representation of a child block comprises drawing a line segment below said transaction fiber.

14. The method of claim 5, further comprising:
   allocating space for said transaction fiber;
   calculating a maximum number of child levels allowed to be displayed in said allocated space;
   totaling number of child fibers of said transaction fiber; and
   truncating the total number of child fibers when said total number of child fibers is greater than said maximum number of child levels allowed in the space allocated for said transaction fiber.

15. The method of claim 5, further comprising:
   allocating space for said transaction fiber;
   calculating a maximum number of child levels allowed to be displayed in said allocated space;
   totaling number of child fibers of said transaction fiber; and
   enlarging said allocated space when said total number of child fibers is greater than said maximum number of child levels allowed in the space allocated for said transaction fiber.

16. A computer program product that includes a computer-readable volatile or non-volatile medium having a sequence of instructions which, when executed by a processor, causes the processor to execute a process for analyzing transaction level simulation data of an integrated circuit design, comprising:

plotting a transaction fiber, said transaction fiber comprising a transaction block; and graphically displaying a compact representation of one or more hidden child blocks of said transaction block indicating a total number of hidden child levels and relative temporal positions of the one or more hidden child blocks when said transaction fiber is in a collapsed state, wherein the transaction fiber is in a collapsed state when the one or more compact representations are displayed without taking plotting space away from other fibers, and wherein the compact representation corresponds to an expanded view which comprises details of at least one of the one or more hidden child blocks that is graphically represented by at least a portion of the compact representation when the at least one of the one or more hidden child blocks is in the collapsed state.

17. The computer program product of claim 16, wherein said transaction block comprises one or more details.

18. The computer program product of claim 17, wherein said one or more details includes a start time.

19. The computer program product of claim 17, wherein said one or more details includes an end time.

20. The computer program product of claim 17, wherein said one or more details includes a label.

21. The computer program product of claim 17, wherein said one or more details includes a memory address.

22. The computer program product of claim 17, wherein said one or more details includes a description of said transaction block.

23. The computer program product of claim 16, wherein a transaction fiber is in a collapsed state when a child fiber of said transaction fiber is not plotted.

24. The computer program product of claim 16, wherein providing a compact representation of a child block comprises drawing a line segment below said transaction fiber graphically displaying a compact representation of one or more hidden child blocks.

25. The computer program product of claim 16, further comprising:

allocating space for said transaction fiber;

calculating a maximum number of child levels allowed to be displayed in said allocated space;

totaling number of child fibers of said transaction fiber; and truncating the total number of child fibers when said total number of child fibers is greater than said maximum number of child levels allowed in the space allocated for said transaction fiber.

26. The computer program product of claim 16, further comprising:

allocating space for said transaction fiber;

calculating a maximum number of child levels allowed to be displayed in said allocated space;

totaling number of child fibers of said transaction fiber; and enlarging said allocated space when said total number of child fibers is greater than said maximum number of child levels allowed in the space allocated for said transaction fiber.

27. A system for analyzing transaction level simulation data of an integrated circuit design, comprising:

means for plotting a transaction fiber, said transaction fiber comprising a transaction block; and means for graphically displaying a compact representation of one or more hidden child blocks of said transaction block indicating a total number of hidden child levels and relative temporal positions of the one or more hidden child blocks when said transaction fiber is in a collapsed state, wherein the transaction fiber is in a collapsed state when the compact representation is displayed without taking plotting space away from other fibers, and wherein the compact representation corresponds to an expanded representation which comprises details of at least one of the one or more hidden child blocks that is graphically represented by at least a portion of the compact representation when the at least one of the one or more child fibers is in the collapsed state.

28. The system of claim 27, wherein said transaction block comprises one or more details.

29. The system of claim 28, wherein said one or more details includes a start time.

30. The system of claim 28, wherein said one or more details includes an end time.

31. The system of claim 28, wherein said one or more details includes a label.

32. The system of claim 28, wherein said one or more details includes a memory address.

33. The system of claim 28, wherein said one or more details includes a description of said transaction block.

34. The system of claim 27, wherein a transaction fiber is in a collapsed state when a child fiber of said transaction fiber is not plotted.

35. The system of claim 27, wherein providing a compact representation of a child block comprises drawing a line segment below said transaction fiber.

36. The system of claim 27, further comprising:

means for allocating space for said transaction fiber;

means for calculating a maximum number of child levels allowed to be displayed in said allocated space;

means for totaling number of child fibers of said transaction fiber; and means for truncating the total number of child fibers when said total number of child fibers is greater than said maximum number of child levels allowed in the space allocated for said transaction fiber.

37. The system of claim 27, further comprising:

means for allocating space for said transaction fiber;

means for calculating a maximum number of child levels allowed to be displayed in said allocated space;

means for totaling number of child fibers of said transaction fiber; and means for enlarging said allocated space when said total number of child fibers is greater than said maximum number of child levels allowed in the space allocated for said transaction fiber.

38. The computer implemented method of claim 1, further comprising:

totaling number of child fibers of said transaction fiber; and truncating a total number of child fibers in a graphical display area when said total number of child fibers is greater than said maximum number of child levels allowed in the space allocated for the transaction fiber.

39. A system for analyzing transaction level simulation data of an integrated circuit design, comprising:

means for allocating space for a transaction fiber, said transaction fiber comprising one or more transaction blocks and one or more child fibers;

means for plotting said transaction fiber within said allocated space;

means for calculating a maximum number of child levels allowed to be displayed in said allocated space; and means for graphically displaying one or more compact representations indicating a total number of hidden child levels and relative temporal positions of hidden child blocks for a fiber, which comprises the transaction fiber or the one or more child fibers, within said allocated space when said fiber is in a collapsed state, wherein the fiber is in a collapsed state when the one or more compact representations are displayed without taking plotting space away from other fibers, and wherein the one or more compact representations correspond to an expanded representation which comprises details of at least one of the one or more child fibers that is graphically represented by at least a portion of the one or more compact representations when the at least one of the one or more child fibers is in the collapsed state.

40. The computer implemented method of claim 1, in which the act of graphically displaying the one or more compact representations comprises graphically depicting at least one of the one or more compact representations as a function of time.

41. The computer implemented method of claim 1, further comprising:

displaying, for each of the transaction fiber and the one or more child fibers, a status indicator indicating whether the each of the transaction fibers and the one or more child fibers is collapsible or expandable.

42. The computer implemented method of claim 5, further comprising:

displaying, for each of the transaction fiber and the subordinate transaction fiber, a status indicator indicating whether the each of the transaction fibers and the one or more child fibers is collapsible or expandable.

43. The computer program product of claim 16, the process further comprising:

displaying, for each of the transaction fiber and the subordinate transaction fiber, a status indicator indicating whether the each of the transaction fibers and the one or more child fibers is collapsible or expandable.

44. The system of claim 27, further comprising:

means for displaying, for each of the transaction fiber and the subordinate transaction fiber, a status indicator indicating whether the each of the transaction fibers and the one or more child fibers is collapsible or expandable.

45. The system of claim 39, further comprising:

means for displaying, for each of the transaction fiber and the one or more child fibers, a status indicator indicating whether the each of the transaction fibers and the one or more child fibers is collapsible or expandable.

\* \* \* \* \*